(12) United States Patent
Shimizu

(10) Patent No.: US 6,191,051 B1
(45) Date of Patent: Feb. 20, 2001

(54) WAFER STORING SYSTEM HAVING VESSEL COATED WITH OZONE-PROOF MATERIAL AND METHOD OF STORING SEMICONDUCTOR WAFER

(75) Inventor: Yuji Shimizu, Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/270,882

(22) Filed: Mar. 17, 1999

Related U.S. Application Data

(62) Division of application No. 08/883,831, filed on Jun. 27, 1997, now Pat. No. 5,944,193.

(30) Foreign Application Priority Data

Jun. 27, 1996 (JP) .................................................. 8-167767

(51) Int. Cl.[7] .................................................. H01L 21/31
(52) U.S. Cl. .................................................. 438/770; 438/787
(58) Field of Search .................................................. 438/770, 787

(56) References Cited

U.S. PATENT DOCUMENTS 5,944,193 * 8/1999 Shimizu .................................................. 206/710
5,972,802 * 10/1999 Nakano et al. .................................................. 438/770

FOREIGN PATENT DOCUMENTS

08083783 * 3/1996 (JP) .

* cited by examiner

Primary Examiner—John F. Niebling
Assistant Examiner—Alexander G. Ghyka

(57) ABSTRACT

A gate oxide layer grown on a semiconductor wafer is liable to be contaminated by organic compound particles in a clean room between the growth of the oxide and the next deposition step, and the semiconductor wafer is sealed in ozonic ambience in a vessel coated with an inner wall of ozone-proof material such as chromium oxide so that the ozone decomposes the organic compound particles without producing new particles.

8 Claims, 3 Drawing Sheets

WAFER STORING SYSTEM HAVING VESSEL COATED WITH OZONE-PROOF MATERIAL AND METHOD OF STORING SEMICONDUCTOR WAFER

This application is a division of Ser. No. 08/883,831, filed Jun. 27, 1997, now U.S. Pat. No. 5,944,193.

FIELD OF THE INVENTION

This invention relates to a semiconductor wafer storing technology and, more particularly, to a wafer storing system having a vessel coated with ozone-proof material and a method of storing a semiconductor wafer.

DESCRIPTION OF THE RELATED ART

A field effect transistor is an important circuit component used in a semiconductor integrated circuit device, and a large number of field effect transistors are fabricated on a semiconductor wafer. When the field effect transistor is fabricated on the semiconductor wafer, a thin gate oxide layer is grown on active areas in the major surface through a thermal oxidation, and conductive material such as poly-silicon is deposited over the thin gate oxide layer. The conductive layer is patterned into gate electrodes by using a photo-lithography and an etching, and dopant impurity is ion implanted into the active areas in a self-aligned manner with the gate electrodes.

Thus, the semiconductor wafer is firstly placed into a thermal oxidizing apparatus, and, thereafter, is moved from the thermal oxidizing apparatus to a reaction chamber of a deposition system. While the semiconductor wafer is being conveyed from the thermal oxidizing apparatus to the reaction chamber of the deposition system, there is a possibility that the thin gate oxide layer is contaminated. Although the thermally oxidizing apparatus and the deposition system are installed in a clean room, contaminant is not perfectly avoidable, and the semiconductor wafer is exposed to the contaminant.

Dust particles of metal and organic compound are typical examples of the contaminant. If the gate oxide layer is contaminated by the metal particles and the organic compound particles, the conductive material is deposited over the contaminated gate oxide layer, and is left between the gate oxide layer and the gate electrode. The contaminant deteriorates the electric properties of the gate oxide layer as reported by Kimura et. al. in "Time Dependent Dielectric Breakdown Phenomena Caused by Carbon Organic Contaminants", Proceedings of 1994 Autumn Meeting of Society of Applied Physics, 19p-ZC-4. The paper teaches that the time dependent dielectric breakdown is increased due to carbon organic contaminants absorbed in the natural oxide grown on a silicon layer.

In order to eliminate the dust, particles from the clean room, a high efficiency particular air filtering system or an ultra low penetration air filtering system is installed in the clean room. The air filtering system decreases the dust particles in the clean room. However, the air filtering system hardly eliminates organic compound particles from the air, and the gate oxide layer is liable to be contaminated by the organic compound particles.

Japanese Patent Publication of Unexamined Application No. 5-259445 discloses a storing technology for a semiconductor wafer. The Japanese Patent Publication of Unexamined Application proposes to store a semiconductor wafer in vacuum or inert gas such as nitrogen gas.

The prior art storing technology disclosed in the Japanese Patent Publication of Unexamined Application is effective against the contamination in so far as the semiconductor wafer is placed in the vacuum or the inert gas immediately after the growth of the gate oxide layer. However, if the semiconductor wafer is exposed to the atmosphere in the clean room, the time dependent dielectric breakdown still takes place at a high percentage.

SUMMARY OF THE INVENTION

It is therefore an important object of the present invention to provide a wafer storing technology which is effective against the contamination by the organic compound particles.

The present inventor contemplated the problem inherent in the prior art wafer storing technologies, and noticed that the prior art wafer storing ambience merely sealed a semiconductor wafer in dust-free atmosphere. If a wafer storing ambience attacked the organic compound particles, the wafer storing ambience would clean the semiconductor wafer by decomposing the organic compound. The present inventor stored a semiconductor wafer in ozone, and evaluated the cleaning capability of ozone as follows.

The present inventor prepared samples where silicon oxide had been grown to 80 angstroms on semiconductor wafers. Conductive material was deposited over the silicon oxide layer of the first sample group within an hour after the growth. The second sample group was stored in a clean room for a week, and, thereafter, the conductive material was deposited over the silicon oxide layer. The third sample group was stored in the nitrogen ambience for a week, and, thereafter, the conductive material was deposited over the silicon oxide layer. The fourth sample group was stored in ozone sealed in a vessel formed of teflon or polytetrafluoroethylene for a week, and, thereafter, the conductive material was deposited over the silicon oxide layer.

The present inventor evaluated the data storing technologies for the first to fourth sample groups from the aspect of the time dependent dielectric breakdown. The present inventor applied potential across the silicon oxide layers of the first to fourth sample groups, and investigated the cumulative percent defective of each sample group in terms of the breakdown charge. The potential was applied to 1 square millimeter, and the injection current density was 0.1 ampere/$cm^2$.

The cumulative percentage defective of each group was plotted in FIG. 1. Plots PL1, PL2, PL3 and PL4 represented the first sample group, the second sample group, the third sample group and the fourth sample group, respectively. The wafer storing technology in ozone did not drastically improve the cumulative percent defective.

The present inventor investigated why the ozone did not improve the cumulative percent defective. The present inventor found that ozone had decomposed the teflon. Although ozone decomposed the organic compound particles adhered to the semiconductor wafer before the entry into the teflon vessel, the teflon newly supplied organic compound particles to the semiconductor wafer, and the semiconductor wafer was contaminated, again.

Although a quartz vessel disclosed in Japanese Patent Publication of Unexamined Application No. 60-32315 or 61-39524 was effective against ozone, it was difficult to form a quartz vessel large enough to store a plurality of semiconductor wafers without a special facility. Moreover, the quartz was so heavy that operators suffered from an inability to easily manipulate the vessel.

To accomplish the object, the present invention proposes to coat a sealing vessel with material hardly decomposed by ozone.

In accordance with one aspect of the present invention, there is provided a wafer storing system for storing at least one semiconductor wafer comprising: a vessel having an inner wall formed of ozone-proof material and defining an airtight chamber so as to accommodate the at least one semiconductor wafer; and a source of ozone supplying ozone to the airtight chamber.

In accordance with another aspect of the present invention, there is provided a method of storing at least one semiconductor wafer, comprising the steps of: a) preparing a vessel having an inner wall formed of ozone-proof material and defining an airtight chamber; b) placing at least one semiconductor wafer in the airtight chamber; c) sealing the at least one semiconductor wafer in the airtight chamber; and d) creating ozonic atmosphere in the airtight chamber.

BRIEF DESCRIPTION OF THE DRAWINGS

The features and advantages of the wafer storing system and the method according to the present invention will be more clearly understood from the following description taken in conjunction with the accompanying drawings in which.

DESCRIPTION OF THE PREFERRED EMBODIMENT

Figure 1:
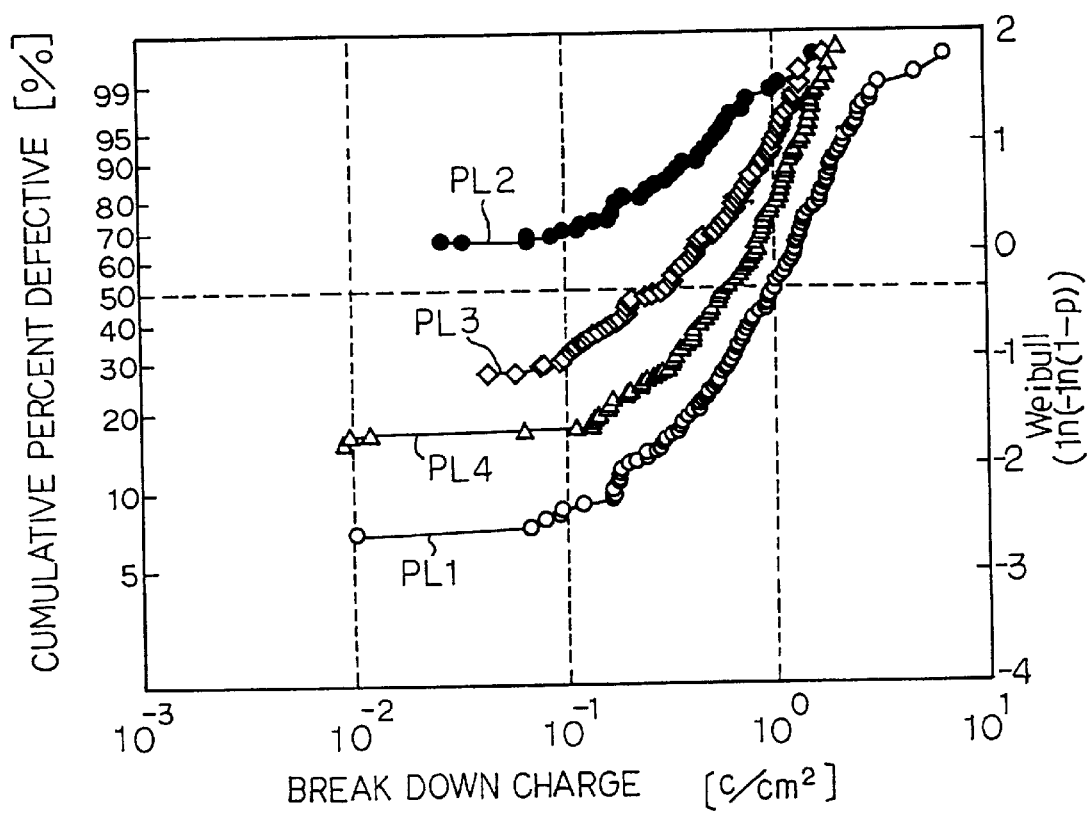
FIG. 1 is a graph showing the cumulative percent defective in terms of breakdown charge investigated for the different wafer storing technologies.
Figure 2:
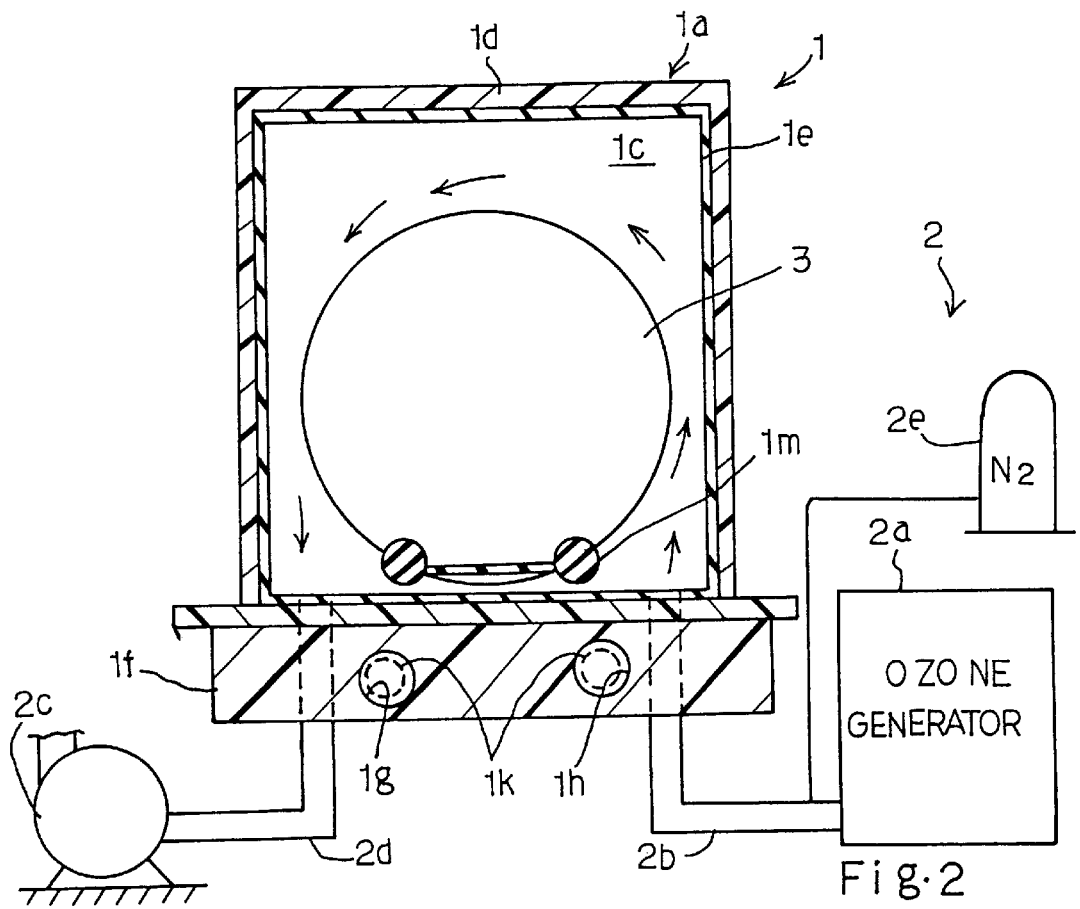
FIG. 2 is a cross sectional view showing the structure of a waver storing system according to the present invention.
Figure 3:
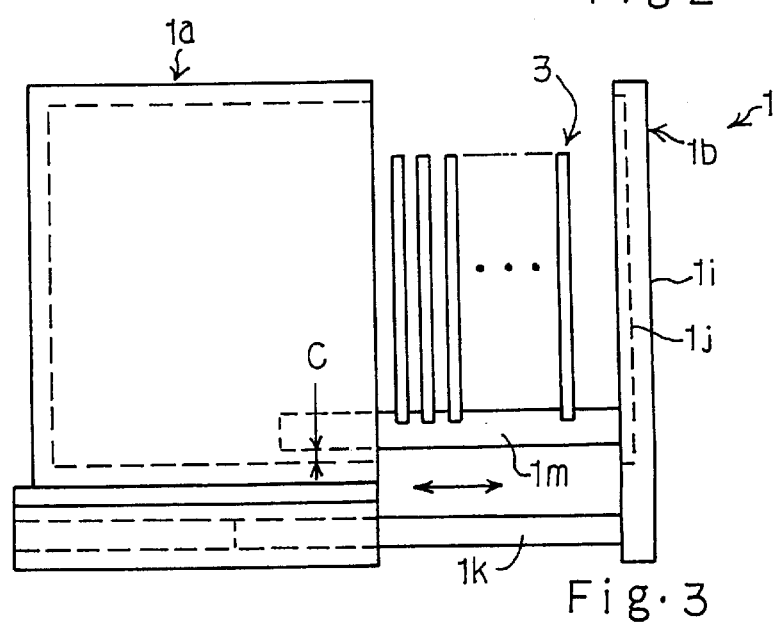
FIG. 3 is a side view showing the wafer storing system.

Referring to FIGS. 2 and 3 of the drawings, a wafer storing system embodying the present invention largely comprises a wafer storing vessel 1 and a gas supplying sub-system 2 connected to the wafer storing vessel 1. The wafer storing vessel 1 includes a stationary case 1a and a slidable lid 1b, and the stationary case 1a and the slidable lid 1b defines an airtight chamber 1c when the slidable lid 1b is closed.

The stationary case 1a has an outer wall 1d formed of synthetic resin such as, for example, polytetrafluoroethylene and an inner wall 1e of ozone-proof material laminated on the outer wall 1d. The stationary case 1a further has a pedestal portion 1f, and two cylindrical holes 1g/1h are formed in the pedestal portion 1f.

The slidable lid 1b also has an outer wall 1i formed of the synthetic resin and an inner wall 1j formed of the ozone-proof material. In this instance, the ozone-proof material is chromium oxide. The slidable lid 1b further has a pair of guide rods 1k inserted into the cylindrical holes 1g/1h, and the guide rods 1k are slidable into and out of the pedestal portion 1f along the cylindrical holes 1g/1h.

A quartz boat 1m is attached to the slidable lid 1b, and a plurality of slits 1n are formed in the quartz boat 1m. A plurality of semiconductor wafers 3 are inserted into the slits 1n so as to stand on the quartz boat 1m. When the slidable lid 1b is drawn from the stationary case 1a, the quartz boat 1m is exposed to an operator, and the operator places the semiconductor wafers 3 onto and picks them up from the quartz boat 1m. On the other hand, when the slidable lid 1b is pushed into the stationary case 1a, the slidable lid 1b is brought into contact with the stationary case 1a, and the semiconductor wafers 3 are sealed in the airtight chamber 1c.

The quartz boat 1m is spaced from the inner wall 1d of the stationary case 1a by distance c, and never scratches the inner wall 1d.

The gas supplying sub-system 2 includes an ozone generator 2a, an inlet pipe 2b connected between the ozone generator 2a and the airtight chamber 1c, an exhaust fan 2c, an outlet pipe 2d connected between the airtight chamber 1c and the exhaust fan 2c and a nitrogen source 2e connected to the inlet pipe 2b. Ozone and nitrogen are selectively supplied to the airtight chamber 1c through the inlet pipe 2b. The ozone is upwardly blown into the airtight chamber 1c, and is evacuated from the airtight chamber 1c by the exhaust fan 2c. The ozone circulates around the semiconductor wafers 3, and decomposes organic compound particles. However, the inner walls 1e/1j withstands the ozone.

When the airtight chamber 1c is designed to accommodate twenty-five semiconductor wafers 3, the volume of the airtight chamber 1c is about 800 cubic centimeters, and the gas supplying sub-system 2 supplies ozone at 500 sccm so as to perfectly create the ozonic ambience in the air tight chamber 1c within 30 minutes.

The present inventor investigated various kinds of material proof against ozone, and concluded that the chromium oxide was the most appropriate ozone-proof material, presently. However, any ozone-proof material is available for the inner walls 1e/1j in so far as it produces organic compound particles less than the teflon.

The semiconductor wafers 3 are stored in the wafer storing system shown in FIGS. 2 and 3 as follows. Field effect transistors are assumed to be fabricated on the semiconductor wafers 3 through the process sequence described hereinbefore.

When silicon oxide is grown on the active areas defined in the semiconductor wafers 3, an operator inserts the semiconductor wafers 3 into the slits of the quartz boat 1m, and the semiconductor wafers 3 stand on the quartz boat 1m. The operator pushes the slidable lid 1b into the stationary case 1a, and the semiconductor wafers 3 are sealed in the airtight chamber 1c.

The ozone generator 2a supplies ozone into the airtight chamber 1c, and the exhaust fan 2c evacuates the air and the ozone from the airtight chamber 1c. As described hereinbefore, the ozone supplying sub-system 2 supplies the ozone at 500 sccm, and perfectly replaces the air in the chamber 1c of 8000 cubic centimeters with the ozone within 30 minutes.

When the ozonic ambience is created in the airtight chamber 1c, the flow rate of ozone is decreased to 10 sccm until a deposition system (not shown) is ready for start. When the deposition system is ready for start, the nitrogen source 2e supplies the nitrogen into the airtight chamber 1c, and the ozone is replaced with the nitrogen. When the ozone is replaced with the nitrogen, the slidable lid 1b is drawn from the stationary case 1a, and the semiconductor wafers 3 are taken out from the quartz boat 1m. The ozone has been already replaced with the nitrogen, and the ozone is not diffused into the clean room. The semiconductor wafers 3 are placed in the reaction chamber of the deposition system, and conductive material is deposited over the silicon oxide layers.

The present inventor evaluated the wafer storing system according to the present invention as follows. The present inventor firstly prepared samples where silicon oxide had been grown to 80 angstroms on silicon wafers. Conductive material was deposited over the silicon oxide layer of the first sample group within an hour after the growth. The second sample group was stored in a clean room for a week, and, thereafter, the conductive material was deposited over the silicon oxide layer. The third sample group was stored in the wafer storing system according to the present invention for a week, and, thereafter, the conductive material was deposited over the silicon oxide layer.

The present inventor checked the first to third sample groups to see whether or not the time dependent dielectric breakdown took place. The present inventor applied potential across the silicon oxide layers of the first to third sample groups, and investigated the cumulative percent defective of each sample group in terms of the breakdown charge. The potential was applied to 1 square millimeter, and the injection current density was 0.1 ampere/$cm^2$.

Figure 4:
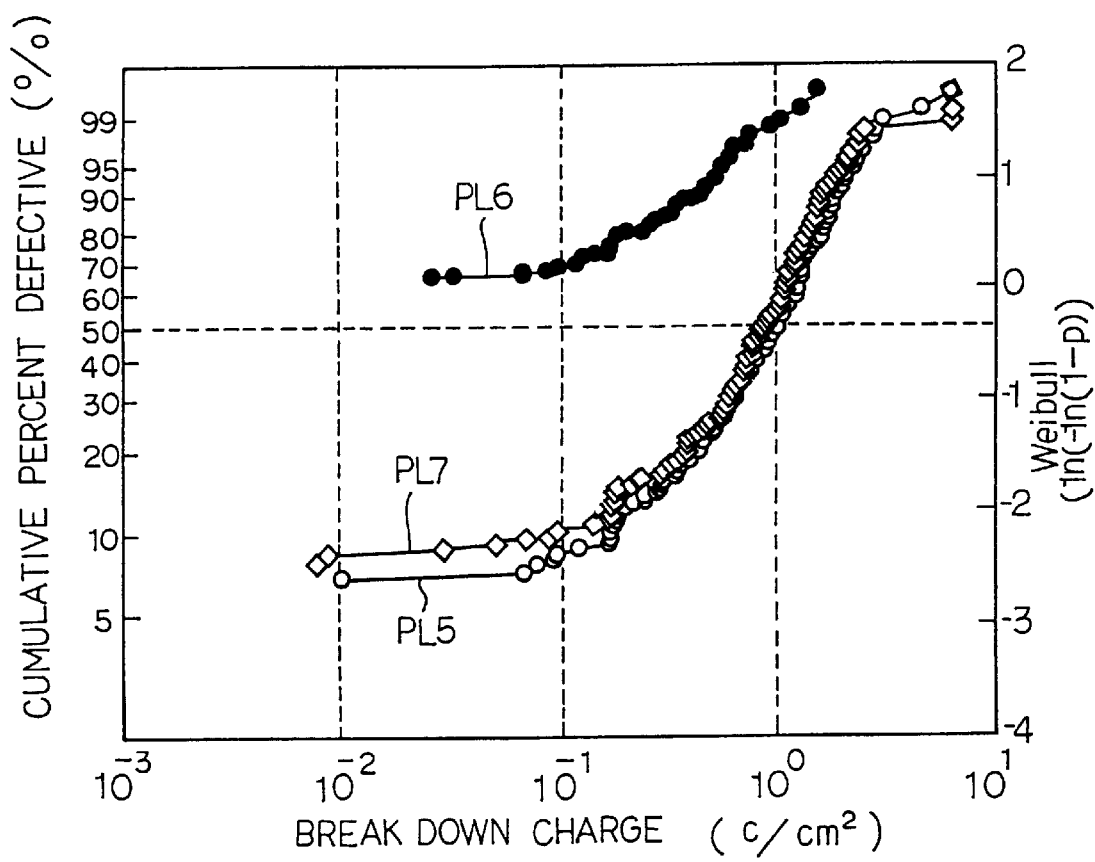
FIG. 4 is a graph showing a cumulative percent defective in terms of breakdown charge achieved by the wafer storing system according to the present invention.

The cumulative percentage defective of each group was plotted in FIG. 4. Plots PL5, PL6 and PL7 represented the first sample group, the second sample group and the third sample group, respectively. As will be understood from plots PL5 to PL7, the inner walls 1e/1j effectively prevented the outer walls 1d/1i from exposure to the ozone, and the wafer storing system according to the present invention improved the time dependent dielectric breakdown characteristics of the third sample group to the same level as the samples covered with the conductive material without an hour delay.

As will be appreciated from the foregoing description, the ozone decomposes organic compound particles adhered to the semiconductor wafers 3 during the exposure to the air in the clean room, and the inner walls 1e/1j of the ozone-proof material do not produce organic compound particles during the storage of the semiconductor wafers 3 in the ozonic ambience. For this reason, the wafer storing system according to the present invention keeps the silicon oxide layers on the semiconductor wafer clean, and the clean silicon oxide layers improve the time dependent dielectric breakdown characteristics of field effect transistors.

Moreover, the laminated structure of the inner/outer walls 1d/1e/1i/1j is lighter than a quartz vessel, and the outer walls 1d/1i of the synthetic resin withstands an unavoidable impact. This results in good manipulability of the wafer storing vessel 1.

Although particular embodiments of the present invention have been shown and described, it will be obvious to those skilled in the art that various changes and modifications may be made without departing from the spirit and scope of the present invention.

For example, the boat 1m may be separated from the slidable lid 1m so that an operator manually inserts the boat 1m into and takes out it from the airtight chamber 1c.

The outer walls 1d/1i may be formed of perfluoroalkoxi, polyvinylchloride, tetrafluoroethylene, copolymer between tetrafluoroethylene and hexafluoropropylene, copolymer between tetrafluoroethylene and ethylene, polychlorotrifluoroethylene, polyvinylidenfluoride and vinylidenfluoride.

What is claimed is:

1. A method of processing at least one semiconductor wafer, comprising the steps:
   (a) forming an oxide layer on a surface of said at least one semiconductor wafer;
   (b) providing a vessel having an inner wall formed of ozone-proof material and defining an air-tight chamber;
   (c) placing said at least one semiconductor wafer with said oxide layer in said air-tight chamber;
   (d) sealing said at least one semiconductor wafer with said oxide layer in said air-tight chamber;
   (e) creating an ozonic atmosphere in said air-tight chamber;
   (f) maintaining said at least one semiconductor wafer with said oxide layer in said ozonated atmosphere in said chamber for a selected time period;
   (g) terminating containment of said wafer in said ozonic atmosphere after said time period; and
   (h) depositing a conductive layer on said oxide layer on said at least one semiconductor wafer.

2. A method as in claim 1, wherein a field-effect transistor is produced on said wafer surface, said oxide layer and said conductive layer together being formed to provide a gate for said transistor.

3. The method as set forth in claim 1, in which said ozone-proof material is chromium oxide.

4. The method as set forth in claim 1, in which said vessel has a multi-layered structure having said inner wall.

5. The method as set forth in claim 4, in which said inner wall is laminated on an outer wall formed of synthetic resin.

6. The method as set forth in claim 5, in which said inner wall is formed of chromium oxide, and said outer wall is formed of the synthetic resin selected from the group consisting of polytetrafluoroethylene, perfluoroalkoxi, polyvinylchloride, tetrafluoroethylene, copolymer between tetrafluoroethylene and hexafluoropropylene, copolymer between tetrafluoroethylene and ethylene, polychlorotrifluoroethylene, polyvinylidenfluoride and vinylidenfluoride.

7. The method as set forth in claim 1, further comprising the step of replacing said ozonic atmosphere with an inert atmosphere in step (g).

8. The method as set forth in claim 7, in which said inert atmosphere is created by nitrogen.

* * * * *